United States Patent
Iwamura

(10) Patent No.: US 7,383,519 B2
(45) Date of Patent: Jun. 3, 2008

(54) SYSTEMS AND METHODS FOR DESIGN VERIFICATION USING SELECTIVELY ENABLED CHECKERS

(75) Inventor: Kenji Iwamura, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 11/074,808

(22) Filed: Mar. 8, 2005

(65) Prior Publication Data

US 2006/0206840 A1    Sep. 14, 2006

(51) Int. Cl.
*G06F 17/50* (2006.01)

(52) U.S. Cl. ............................................. 716/4; 716/5

(58) Field of Classification Search ............ 716/5, 716/4
See application file for complete search history.

(56) References Cited

U.S. PATENT DOCUMENTS

| | | | |
|---|---|---|---|
| 6,658,633 B2 * | 12/2003 | Devins et al. ................. | 716/5 |
| 6,810,372 B1 * | 10/2004 | Unnikrishnan et al. ....... | 703/13 |
| 6,883,150 B2 * | 4/2005 | Soltis et al. .................. | 716/4 |
| 6,993,470 B2 * | 1/2006 | Baumgartner et al. ........ | 703/17 |
| 7,162,703 B1 * | 1/2007 | Aik .............................. | 716/5 |

OTHER PUBLICATIONS

Ludden et al; "Functional verification of the POWER4 microprocessor and POWER4 multiprocessor systems;" IBM Journal of Research and Development; Jul. 15, 2001; pp. 53; vol. 46 Issue 1.

* cited by examiner

*Primary Examiner*—Stacy A Whitmore
(74) *Attorney, Agent, or Firm*—Law Offices of Mark L. Berrier

(57) ABSTRACT

Systems and methods for performing design verification testing in which test cases are analyzed to determine the characteristics that will be verified in a module under test, and in which the identified characteristics are used to selectively enable checker modules needed to verify the characteristics implicated by the test cases, while disabling other checker modules. In one embodiment, a system includes a test case analyzer and a checker selector. The test case analyzer analyzes one or more test cases and identifies test case characteristics that are associated with each of the test cases. The checker selector is coupled to the test case analyzer and receives identification of the test case characteristics from the test case analyzer. The checker selector then selectively enables a first set of design verification checkers and disables a second set, based on the test case characteristics identified for the test cases.

20 Claims, 5 Drawing Sheets

SYSTEMS AND METHODS FOR DESIGN VERIFICATION USING SELECTIVELY ENABLED CHECKERS

BACKGROUND

1. Field of the Invention

The invention relates generally to the design of electronic devices, and more particularly to systems and methods for improving the efficiency of environments for verifying the designs of devices such as integrated circuits.

2. Related Art

Electronic devices are becoming increasingly complex. As the complexity of these devices increases, there is a greater possibility that defects will impair or impede proper operation of the devices. The testing of these devices is therefore becoming increasingly important.

Testing of a device may be important at various stages, including in the design of the device, in the manufacturing of the device, and in the operation of the device. Testing at the design stage ensures that the design is conceptually sound. Testing of prototype devices ensures that the conceptual design was accurately translated to the manufactured device. Testing during the manufacturing stage may be performed to ensure that the manufacturing processes used to build the device achieve the desired results. Even after the device is manufactured, the device may be tested for a burn-in period in order to identify devices that are expected, statistically, to fail early in their normal usage.

Testing is performed during the design stage of the device in order to determine how the device will operate if constructed according to a particular design. This testing may therefore be referred to as design verification testing. By identifying design defects during design verification testing, the defects can be corrected prior to manufacturing. It is thereby possible to avoid incurring the expense of tooling up to build a prototype, building and testing the prototype to identify the defects, and then re-tooling to build another prototype.

Design verification testing typically involves generating a model to simulate the device, providing various inputs to the device, and then comparing outputs generated by the simulation to a set of expected outputs. If the simulated outputs are as expected, the design is verified, and manufacturing of the device can proceed. If the simulated outputs are not as expected, the design defects that caused the errors in the simulated outputs can be corrected, and the design can be re-verified.

A conventional design verification testing system includes a means for simulating the device, a means for generating inputs to the simulated device, and a means for determining whether the simulated outputs are as expected. There are a number of tools that are commercially available to simulate electronic devices. These tools typically utilize a description of the device written in a hardware description language (HDL) to model the behavior of various components within the device. A verification tool then takes a test case and generates a corresponding set of inputs for the simulated device. The inputs are applied to the model of the device, and a set of outputs are generated. The verification tool then compares these outputs to a set of expected outputs and determines whether the simulated device operated as expected.

The comparison of the simulated outputs to the expected outputs is performed by a set of checkers in the verification tool. Typically, each checker is configured to check a certain feature in the simulated device. For example, a particular checker might verify atomic memory accesses. Another checker might verify floating point processing unit operations. A checker typically includes one or more assertions (expected results or conditions) and a means to compare the actual behavior of the design being tested to the assertions. Because, at some point in the testing, it may be necessary to test all of the features in the device, conventional verification tools incorporate all of the checkers. Since the checkers are typically implemented as software modules, it is therefore necessary to incorporate all of the checker modules into a single compilation that can be accessed by the verification tool.

Because of the many checkers that are necessary to verify all of the features of a typical device (e.g., a processor core,) this compilation can be quite large. Also, because all of the checkers are executed, whether they are actually needed or not, a great deal of processing time is often used in the execution of unnecessary checker modules. These problems are addressed in conventional design verification systems by compiling several reduced compilations of checker modules. Having multiple reduced compilations, however, requires more storage space than a single compilation, and even the reduced compilations contain checker modules that are not needed and that simply waste processing resources during verification testing.

It would therefore be desirable to provide systems and methods for design verification testing that do not require as many resources as conventional systems to perform the testing and to store the modules of the verification tools.

SUMMARY OF THE INVENTION

One or more of the problems outlined above may be solved by the various embodiments of the invention. Broadly speaking, the invention includes systems and methods for performing design verification testing in which test cases are analyzed to determine the characteristics that will be verified in a module under test (MUT) by the corresponding test cases, and in which the identified characteristics are used to selectively enable and disable components of a design verification tool as needed to verify the characteristics implicated by the test cases.

One embodiment comprises a system including a test case analyzer and a checker selector. The test case analyzer is configured to analyze one or more test cases and to identify test case characteristics that are associated with each of the test cases. The checker selector is coupled to the test case analyzer and is configured to receive identification of the test case characteristics from the test case analyzer. The checker selector then selectively enables a first set of design verification checkers and disables a second set, based on the test case characteristics identified for the test cases.

In one embodiment, the test case analyzer is configured to associate identifiers with each of the test cases, where each of the identifiers corresponds to a particular test case characteristic. Each of the design verification checkers may also be associated with one or more of the test case characteristic identifiers. The checker selector is then configured to enable ones of the design verification checkers that are associated with the test case characteristic identifiers that are provided by the test case analyzer as characteristics of the test cases. The system may be configured to enable the checkers by selectively loading dynamically loadable objects. The system may also be configured to provide verification coverage data to a user, including information identifying those checkers which are enabled for each test case.

An alternative embodiment comprises a method implemented in a design verification environment, including identifying characteristics associated with a set of test cases and enabling a first set of design verification checkers and disabling a second set of checkers based on the identified characteristics associated with the test cases. The characteristics associated with the test cases may be identified by associating tags or other identifiers with each test case, wherein each tag corresponds to a particular characteristic. These identifiers may also be associated with the design verification checkers to identify characteristics verified by each checker. Checkers that are associated with the test case identifiers may then be selectively enabled. The checkers may be enabled, for example, by loading corresponding dynamically loadable objects. When the test cases are simulated, verification coverage data, including information identifying the checkers that are enabled for each test case, may be provided to a user.

Another alternative embodiment comprises a software program product comprising a storage medium readable by a computing system, wherein the storage medium contains one or more instructions configured to cause the computing system to perform a method as described above.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
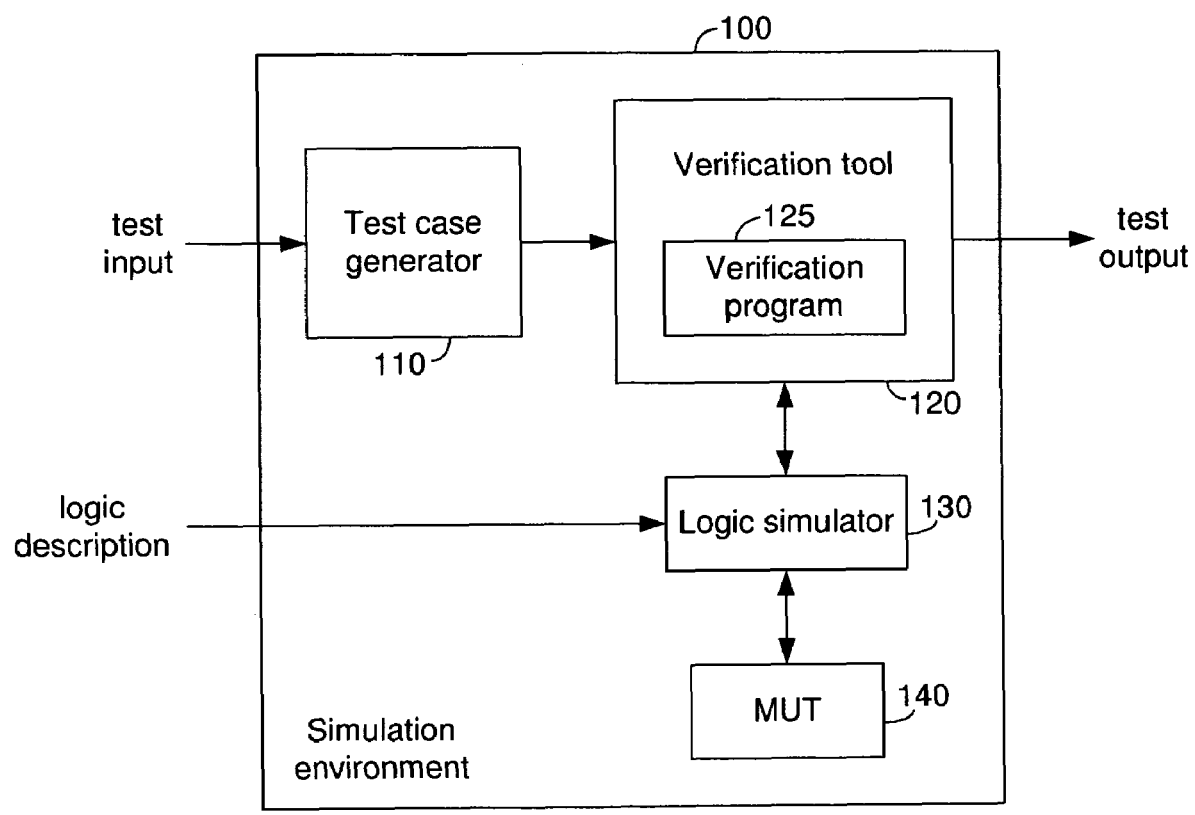
FIG. 1 is a diagram illustrating the components of a typical simulation environment.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for performing design verification testing. Rather than simply compiling checker modules corresponding to all of the features that will potentially be tested into the verification tool, the present systems and methods analyze a set of test cases to determine the features that will be tested, and then selectively enable only those checker modules which are required to test the identified features.

One embodiment comprises a design verification environment. This environment is used to verify the design of integrated circuits. The verification environment includes a test case generator, a verification tool, and a logic simulator. A module under test may also be considered part of the verification environment.

The verification tool includes a test case analyzer and a checker selector. The test case analyzer is configured to analyze test cases received from the test case generator and to identify test case characteristics that are associated with each of the test cases. The test case analyzer may tag the test cases with identifiers indicating the characteristics of each test case. The checker selector is configured to receive identification of the test case characteristics from the test case analyzer. The checker selector then selectively enables a first set of design verification checkers and disables a second set, based on the test case characteristics identified for the test cases. In other words, the checker selector enables checkers which are configured to verify the characteristics associated with the test cases, and disables checkers that are not needed to verify the test cases. When the test cases are simulated, the verification tool includes in its output indications of which checkers are active and which are inactive during each test case.

Referring to FIG. 1, a diagram illustrating the components of a typical simulation environment is shown. In this embodiment, simulation environment 100 includes a test case generator 110 a verification tool 120, a logic simulator 130, and a module under test (MUT) 140. Simulation environment 100 is used to examine the behavior of a device (or devices) that are modeled by logic simulator 130 and MUT 140. Test case generator 110 provides one or more test scenarios to verification tool 120. Verification tool 120 and then converts these scenarios to inputs which are provided to logic simulator 130 (and MUT 140.) Outputs generated by logic simulator 130 (and MUT 140) are returned to verification tool 120, which processes these outputs and provides the resulting test outputs (e.g., verification coverage data) to a user.

Test case generator 110 may generate the test scenarios, or test cases, automatically based upon test inputs that are provided by a user. These test inputs define the types of scenarios that the user desires to be generated for the testing of the device designed as defined by logic simulator 130 and MUT 140. The test inputs may be as simple as a list of features that the user wishes to test (e.g., atomic memory access, addressing modes, and so on,) or they may be more complex, defining specific details of the test scenarios (e.g., specific memory locations to be tested, specific instructions to be executed, etc.) Test case generator 110 may be configured in various ways that are well known in the art of design verification testing. Because the design and configuration of test case generators are well known, they will not be described in detail here.

It should be noted that, as an alternative to the automatic generation of test cases using a test case generator, test cases may be generated manually. The manually generated test cases can be provided as inputs to verification tool 120 in the same manner as the test cases that are automatically generated by test case generator 110.

The automatically or manually generated test cases are provided as inputs to verification tool 120. In one embodiment, verification tool 120 comprises a computing system that executes a verification program 125. Verification program 125 includes modules that are configured to translate the test cases into stimuli for logic simulator 130 and MUT 140. In other words, these modules generate signals that are provided to logic simulator 130 and MUT 140 to simulate the signals that would be received by the device represented by the logic simulator and MUT in the scenarios defined by the test cases. Verification program 125 also includes modules (referred to as checkers) that are configured to receive output signals generated by logic simulator 130 and MUT 140 and to verify the signals. That is, these modules examine the generated output signals and compare them with expected signals to determine whether the design of the modeled device provides the expected behavior.

Verification tool 120 interacts with logic simulator 130 and MUT 140, which, as noted above, model the behavior of the device design being tested. The details of the design being tested are provided to logic simulator 130 in a conventional design language, such as VHDL, Verilog, or the like. Logic simulator 130 interprets this information and provides responses to stimuli that simulate the behavior of the device. In this environment, MUT 140 is the design that is the primary focus of the testing. MUT 140 may be a software simulation of a design, or it may be actual hardware. Logic simulator 130 simulates the behavior of components that will interact with MUT 140. While logic simulator 130 is typically simulated in software, it may also include hardware components. It should be noted that, although logic simulator 130 is depicted in this embodiment as being separate from MUT 140, alternative verification environments may utilize logic simulator 130 or MUT 140 individually (i.e., one without the other.)

Figure 2:
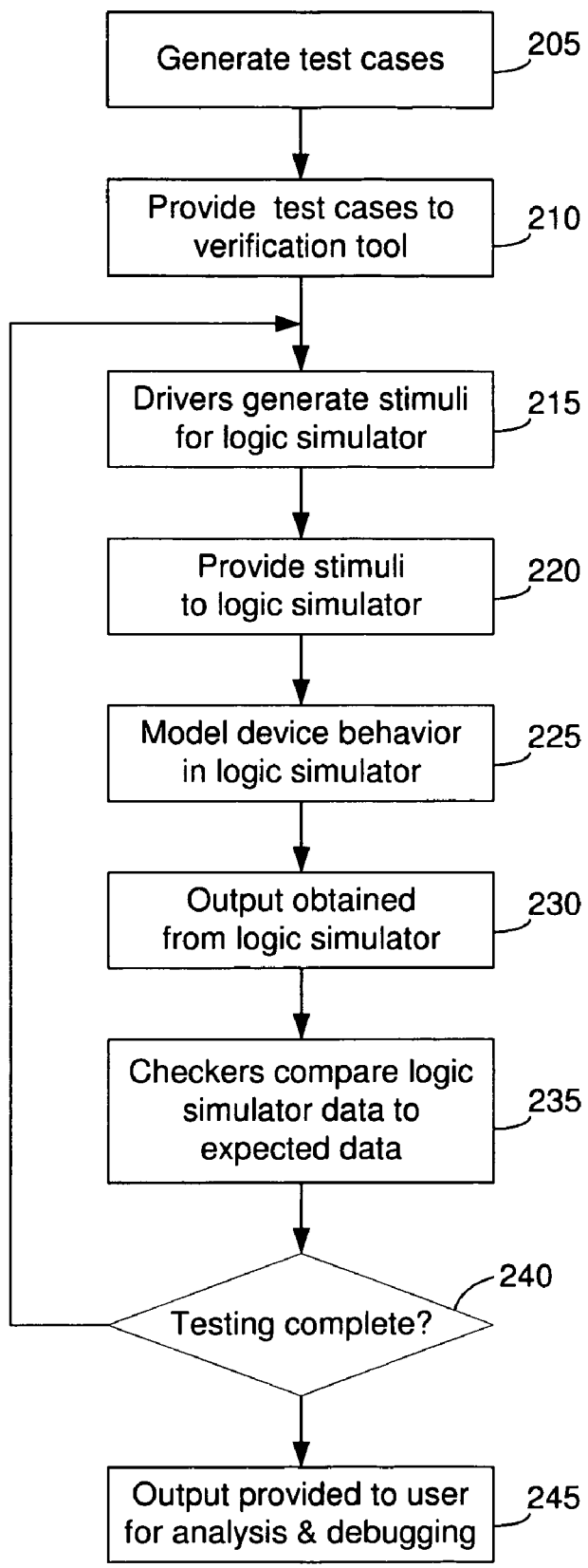
FIG. 2 is a flow diagram illustrating the operation of a simulation environment as depicted in FIG. 1.

The operation of simulation environment 100 can be summarized as shown in the flow diagram of FIG. 2. As shown in this figure, a set of tests cases is first generated (block 205.) The tests cases are then provided to the verification tool (block 210.) The tests cases are translated by drivers within the verification tool into stimuli for the modeled device (block 215.) These stimuli are then provided from the verification tool to the simulator and/or MUT (block 220.) The simulator and/or MUT then process the received stimuli (block 225) and generate a corresponding set of output signals which are provided to the verification tool (block 230.) Checker modules within the verification tool then examine the outputs received from the simulator and/or MUT and compare these outputs to expected results for the tests cases (block 235.) If testing is not complete, steps 215-235 are repeated (block 240.) The verification tool then generates one or more outputs that are provided to a user for analysis, debugging, etc. (block 245.)

The generation of stimuli, simulation of the MUT, obtaining output signals and comparison of the outputs to expected values (blocks 220-235 of FIG. 2) can be viewed as occurring at the test case level or at the level of steps within each test case. At the test case level, all of the stimuli generation, simulation and output generation may be performed before the outputs are checked against expected values. It is more common to perform the steps of FIG. 2 repeatedly within each test case. For example, for each clock cycle, stimuli may be generated, the MUT may be simulated and outputs may be obtained. These outputs may then be checked against the expected values at each cycle.

In the present systems and methods, the checker modules within the verification tool are selectively enabled, based upon the features of the simulated device that are verified by the test cases. In one embodiment, the test cases are analyzed to determine the features of the simulated device that will be exercised by the test cases. Then, only the checkers that verify the features exercised by the test cases are enabled. The remainder of the checkers in this embodiment are disabled. It should be noted that there may not be a readily identifiable correspondence between features of the MUT and checkers in the simulation environment. It may therefore be more practical to enable or disable some checkers without regard to the specific characteristics that are identified for a particular test case. These checkers may be manually enabled/disabled, or may always be turned on.

By selectively enabling only those checkers that are needed to verify the features exercised by the test cases, the present systems and methods may reduce the amount of space that is required to store compilations of checker modules, as well as the processing resources that are required to execute these checker modules in verifying the results of the test cases. The selective enabling of specific checker modules may also reduce false failures identified by the verification system.

The advantages of the present systems and methods arise from the fact that, in conventional design verification environments, the checkers are statically linked to the environment and are always enabled. Thus, whenever a test case is run, all of the checkers are executed, whether they are relevant to the test case or not. As a result, unneeded checkers continually monitor the output of the device simulated in the verification environment to check features are characteristics that are not intended to be tested by the test cases. This wastes processing resources and increases the runtime for a given test case.

Additionally, false failure indications may be generated because some test cases may be designed to test the handling of abnormal conditions. For example, an illegal memory access such as a cache line fetch operation to a cache-inhibited segment of memory may be attempted in order to determine whether the device correctly asserts an illegal-access flag signal. The device must not assert the flag unless it is actually performed by the test case. If a checker only looks at the flag to make sure that the device does not assert the flag, the checker will report a false fail on a test case which intentionally performs the illegal memory access. In other words, the illegal-access flag signal normally indicates an error condition, but when this feature is being tested, the assertion of the flag signal is expected, and the absence of the flag indicates a failure of the test case. Of course, the checker can be enhanced to report fails when the flag is asserted and there has been no such illegal access, but this may require too much of a development effort if the large majority of test cases do not perform the illegal access. The checker should instead be disabled when the small number of test cases which perform the illegal access are simulated.

In regard to the unnecessary use of processing resources, it is common in conventional design verification environments to maintain several compilations of checker modules, where one of the compilations may contain all of the checker modules, but each of the other compilations contains a reduced set of checkers. By linking one of the reduced compilations to the verification environment, some of the unused checkers may be eliminated, thereby eliminating the processing time required to execute these checkers.

The use of reduced-set checker compilations provides the benefit of reducing the processing requirements for the design verification environment to some extent. Typically, however, there are only a few of these reduced-set compilations, so each one still contains a number of checker modules that are not used when running a given test case. Because of the many possible combinations of features that could be tested, it would be impractical to provide a different checker compilation for each of the possible combinations of features that could be tested, as an extremely large amount of storage space would be required for these compilations. Even if only a few of the reduced-set compilations are maintained, the storage requirements for these compilations is much greater than for the single compilation that includes all of the checker modules.

By maintaining a single library of selectively enabled checker modules and then enabling only particular ones of the checkers that are needed for a given test case, it is possible to achieve the benefit of reduced processing time without increasing the amount of storage space that is required to support the design verification environment.

Figure 3:
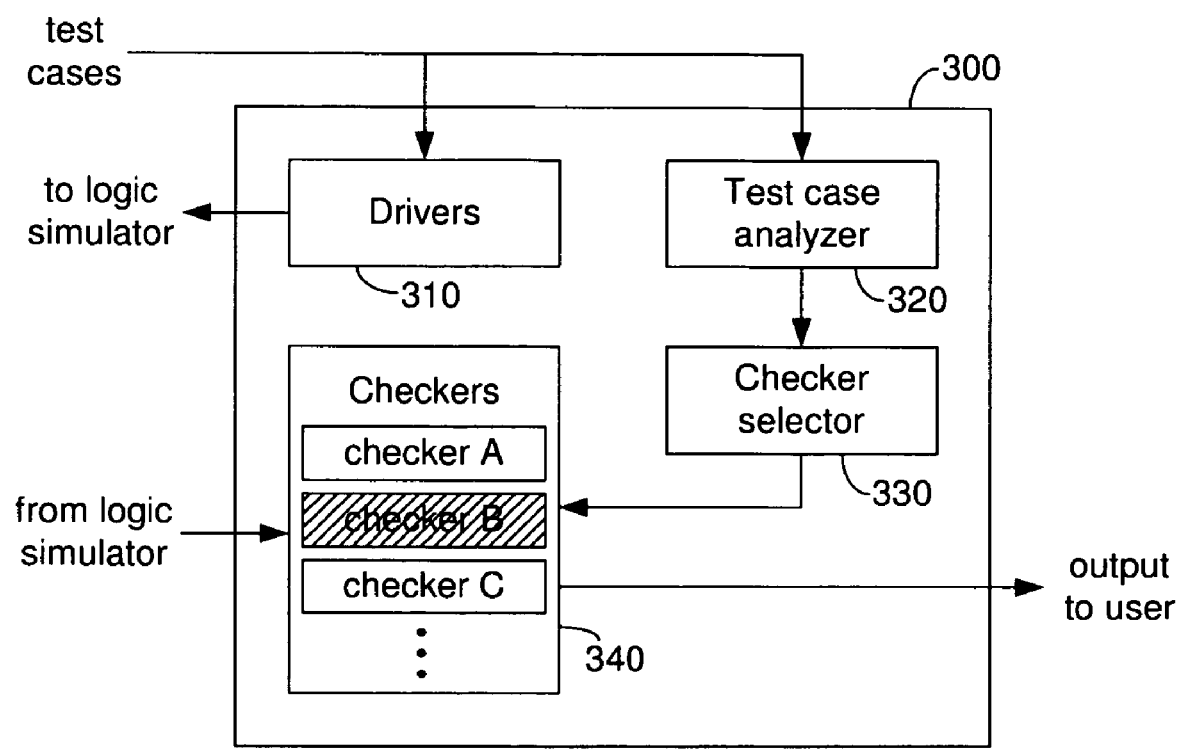
FIG. 3 is a functional block diagram illustrating the structure of a design verification tool in accordance with one embodiment.

Referring to FIG. 3, a functional block diagram illustrating the structure of a design verification tool in accordance with one embodiment is shown. As depicted in this figure, verification tool 300 includes a set of drivers 310, a test case analyzer 320, a checker module selector 330 and a set of checker modules 340. In one embodiment, drivers 310, test case analyzer 320, checker module selector 330 and checker modules 340 are implemented as software components of a verification program, although in other embodiments, one or more of these components could be implemented in hardware.

As shown in FIG. 3, test cases are received by verification tool 300 and are forwarded to both drivers 310 and test case analyzer 320. Drivers 310 function in the same manner as drivers in conventional verification tools. In other words, drivers 310 translate the test cases into one or more signals that are provided as inputs to a logic simulator (not shown in FIG. 3.)

When the test cases are received by test case analyzer 320, the test cases are analyzed to determine the features that will be exercised by each of the test cases. In one embodiment, test case analyzer 320 identifies attributes or characteristics of each test case that describe the types of the respective test cases. The analysis of the test cases can be performed in a variety of ways, such as using pattern matching algorithms, test description rules, heuristic algorithms or any other suitable information analysis techniques. If, for example, a test case consists of a sequence of microprocessor instructions, a pattern matching technique could be applied to identify the characteristic of having a load instruction after a store instruction to the same address. Alternatively, a heuristic technique could be applied to the sequence of instructions to determine whether the test case (the sequence of instructions) is memory-intensive, ALU-intensive, generic, etc.

In this embodiment, after a test case is analyzed, the test characteristics that are identified for the test case are associated with that test case. Test case analyzer may, in one embodiment, include a correlator component that is configured to associate the test characteristics with the test cases. The test case characteristics can be narrow or broad. The correlation between test cases and test case characteristics can be one-to-one, one-to-many, or many-to-many. The association of the test characteristics with the test cases may occur as each case is analyzed, or the association may be made after completion of the analysis of all of the test cases. The association of test characteristics with a particular test case must be performed before or during simulation of that test case.

The association of the characteristics with the corresponding test cases may be accomplished in a variety of ways. For example, each test case can be tagged with a string that identifies one or more test characteristics that are associated with the test case. Alternatively, the test cases can be stored in groups that are categorized by the corresponding test case characteristics. Another alternative might be to tag each of the identified test case characteristics with the names of those test cases that include these characteristics. The manner in which the test cases and test characteristics are associated may be made flexible, so that test cases can be looked up by characteristics, or so that test case characteristics can be looked up by test cases. It is possible to implement a mechanism for associating test characteristics with test cases using simple file naming rules, directory structures, symbolic links, databases, relational databases (RDB) or other suitable techniques.

It should be noted that, although test case analyzer 320 is implemented in this embodiment as part of verification tool 300, it may be implemented in different ways in other embodiments. For example, the test case analyzer many alternatively be implemented as part of a test case generator (not shown in FIG. 3.) Test characteristics could, in this case, be identified as the test cases are generated and associated with the test cases before the test cases are provided to the verification tool. As yet another alternative, test case analyzer 320 could be implemented as a mechanism which is separate from of the test case generator and verification tool 300. In such an embodiment, the test cases could be generated and provided to a test case analyzer, and then the test cases and associated test characteristics could be provided to the verification tool. The test case analyzer may be implemented in hardware or software, and the test characteristics can be generated and associated with the test cases before or during the simulation of the test cases.

Referring again to FIG. 3, after the test cases have been analyzed, the test case characteristic information is passed from test case analyzer 320 to checker selector 330. Checker selector 330 uses the test case characteristic information to determine which checkers should be enabled, and which checkers should be disabled. In order to do this, checker selector 330 implements a mechanism for correlating the test case characteristics to the various checkers.

In one embodiment, each of the checkers is associated with one or more test case characteristics in much the same way the test cases are associated with the characteristics. Each checker can be categorized or otherwise associated with particular test case characteristics to identify those test case characteristics for which the checker will be effective. This can be done by attaching identifiers such as attribute data to each checker, by implementing naming rules, by implementing mappings between checkers and test characteristics, or by using any other suitable mechanism for correlating the characteristics to the checkers.

A checker may be affirmatively associated with a test characteristic (i.e., the checker should be enabled when the test characteristic is identified,) or it may be negatively associated with a test characteristic (i.e., the checker should be disabled when the test characteristic is identified.) For example, a checker can be identified as effective (valid) for power-down mode, for memory mapped input/output (MMIO) commands, for load-hit-store sequences, etc., or it can be identified as invalid for these characteristics. Each checker can be identified as valid/invalid for one test characteristic, or for many.

Checker selector 330 uses the correlations between the test cases and test characteristics, and between the test characteristics and checkers to select appropriate ones of the available checkers to be enabled when the test cases are run. In one embodiment, this is accomplished by determining which test characteristics are identified for a particular test case, then determining which of the checkers are valid for the identified characteristics. If a checker is valid for one of the identified test characteristics, it is enabled for the test case. If a checker is not valid for any of the identified test characteristics (or is invalid for any one of the identified test characteristics,) then it is disabled for the test case. Table 1 below shows examples of the resulting correlations between characteristics identified in the test cases and the effects of the checkers selected because of these characteristics.

TABLE 1

| TEST CASE CHARACTERISTIC | EFFECT OF SELECTED/ ENABLED CHECKER |
| --- | --- |
| Includes atomic memory access | Enable atomic checkers |
| No atomic memory access | Disable atomic checkers |
| Real addressing mode only | Enable real translation checker |
| Includes specification Ch. 3 instructions | Enable checkers marked for specification Ch. 3 |
| Includes cache fill operation | Enable data prefetch checkers |
| CPU in cache inhibited mode | Disable page attribute checker |
| Intentional illegal access to I/O | Disable I/O checkers |

In one embodiment, checker selector 330 selects the appropriate ones of checkers 340 for each test case when that test case is run. In other words, the individual checkers are enabled/disabled on a test-case-by-test-case basis. Thus, the set of checkers that are enabled for a first test case may not be the same as the set that is enabled for a subsequent test case. In an alternate embodiment, the checkers may be enabled/disabled on a batch basis, so that the same set of checkers is enabled for a group of test cases that are run together (i.e., in a batch.) It should be noted that the verification tool may be configured to allow a user to manually enable or disable selected checkers. Manual selection of checkers may be designed to override the automatic selection of the checkers by checker selector 330, or may be subject to the automatic selections.

Checker selector 330 can be implemented in a variety of ways. In one embodiment, a switch variable is assigned to each checker. The switch variables for the checkers are then set according to the test characteristics identified for the test cases. After the switch variables have been set, the simulation of the test cases can be performed. During the simulation, each of the available checkers is switched on (enabled) or off (disabled) according to the respective switch variable. In an alternative embodiment, each checker can be implemented as a dynamic load object, such as a DLL in a Windows-based system or a dynamic loadable object in a UNIX-based system. Any other suitable hardware or software technique may be used to enable/disable the checkers in other alternative embodiments.

When the appropriate checkers have been selected, the simulation of the test cases can proceed. Drivers 310 generate signals corresponding to the test cases and provide these signals to the logic simulator. The logic simulator simulates the behavior of the device (or design) under test using the signals provided by drivers 310. During the simulation, the ones of checkers 340 that have been enabled by checker selector 330 monitor events corresponding to their respective functions. Those ones of checkers 340 that are disabled do not function during the simulation (i.e., the corresponding checker program code is not executed.) The individual ones of checker 340 that are enabled function in essentially the same manner as in conventional systems.

The results of the checkers' comparisons of the simulated behavior of the MUT to expected behavior is provided to a user in some form. This information is often provided as verification coverage data. Information on coverage events is typically gathered to estimate the progress of the verification process and the level (quality) of the verification, to identify verification failures, and so on. Because it may be useful for the user of verification tool 300 to know which of the checkers were enabled (and which were disabled) for a particular test case, the verification coverage data is supplemented in one embodiment with information indicating which of the checkers were enabled or disabled for each test case. From the verification coverage data and the checker enable/disable information, it can be determined whether the checker selection is optimal, and whether necessary checkers were actually enabled for the applicable test cases.

Figure 4:
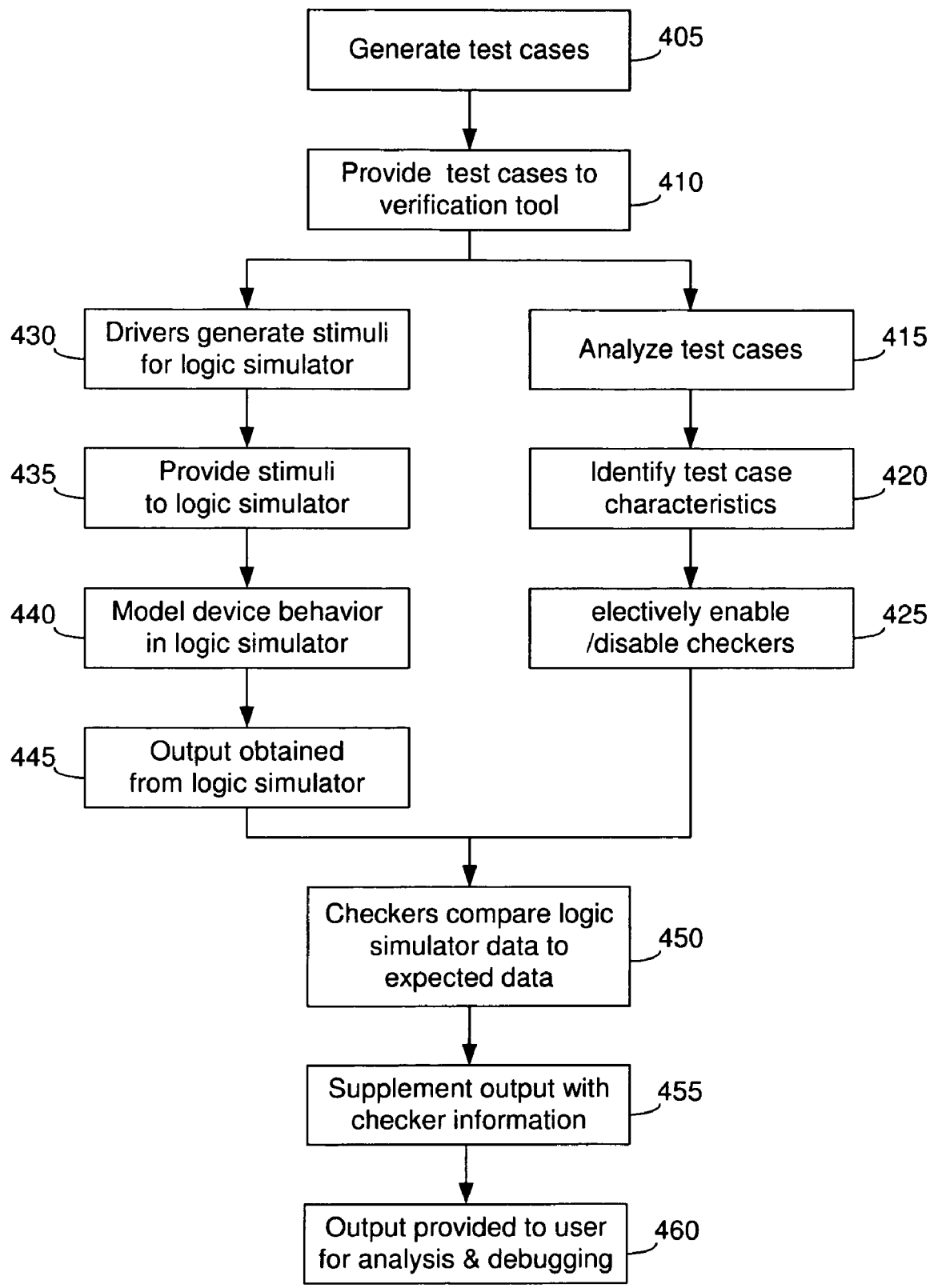
FIG. 4 is a flow diagram illustrating the operation of a simulation environment in accordance with the embodiment of FIG. 3.

The operation of a simulation environment using the verification tool described above in connection with FIG. 3 can be summarized as shown in FIG. 4. The method depicted in FIG. 4 begins with the generation of the test cases (block 405.) The test cases may be generated automatically or manually. The test cases are then provided to the verification tool (block 410.) As noted above, the test cases are provided to both the drivers for the logic simulator and the test case analyzer.

The received test cases are analyzed (block 415) and the test case characteristics associated with each of them is identified (block 420.) Based on the test case characteristics identified for each of the test cases, specific ones of the checkers are enabled, while others are disabled (block 425.)

When the appropriate ones of the checkers have been enabled/disabled, the simulation can proceed. The drivers then generate signals corresponding to the test cases (block 430) and provide these signals to the logic simulator (block 435.) The logic simulator uses these input signals to model the behavior of the device/design under test (block 440.) (As noted above, the simulation may involve both software simulation and the operation of actual hardware for the MUT.) The activity of the logic simulator and/or MUT is monitored by the enabled checkers during the simulation and the necessary information from and/or output of the modeled device are provided to the checkers (block 445.)

The checkers compare the information received from the simulation to expected data to verify that the simulated device is operating as expected (block 450.) Information regarding which of the checkers were enabled/disabled is then used to supplement the more typical verification coverage data (block 455) and the supplemented data is provided to a user (block 460.)

Steps 430-450 of FIG. 4 are shown as being performed in parallel with the analysis of test cases and enabling of appropriate checkers. This corresponds to performing the stimuli generation, simulation and output generation at the test level before checking the outputs against expected values. It should be noted that, however, that these steps can alternatively be performed at the level of steps within each test case. For instance, as with the method of FIG. 2, stimuli may be generated, the MUT may be simulated and outputs may be obtained for each clock cycle and checked against expected values after each cycle. In this case, steps 415-425 would be performed before steps 430-450. Steps 430-450 would then be performed repeatedly until testing is complete. Steps 455 and 460 could be performed at each cycle, or after testing is complete.

Figure 5:
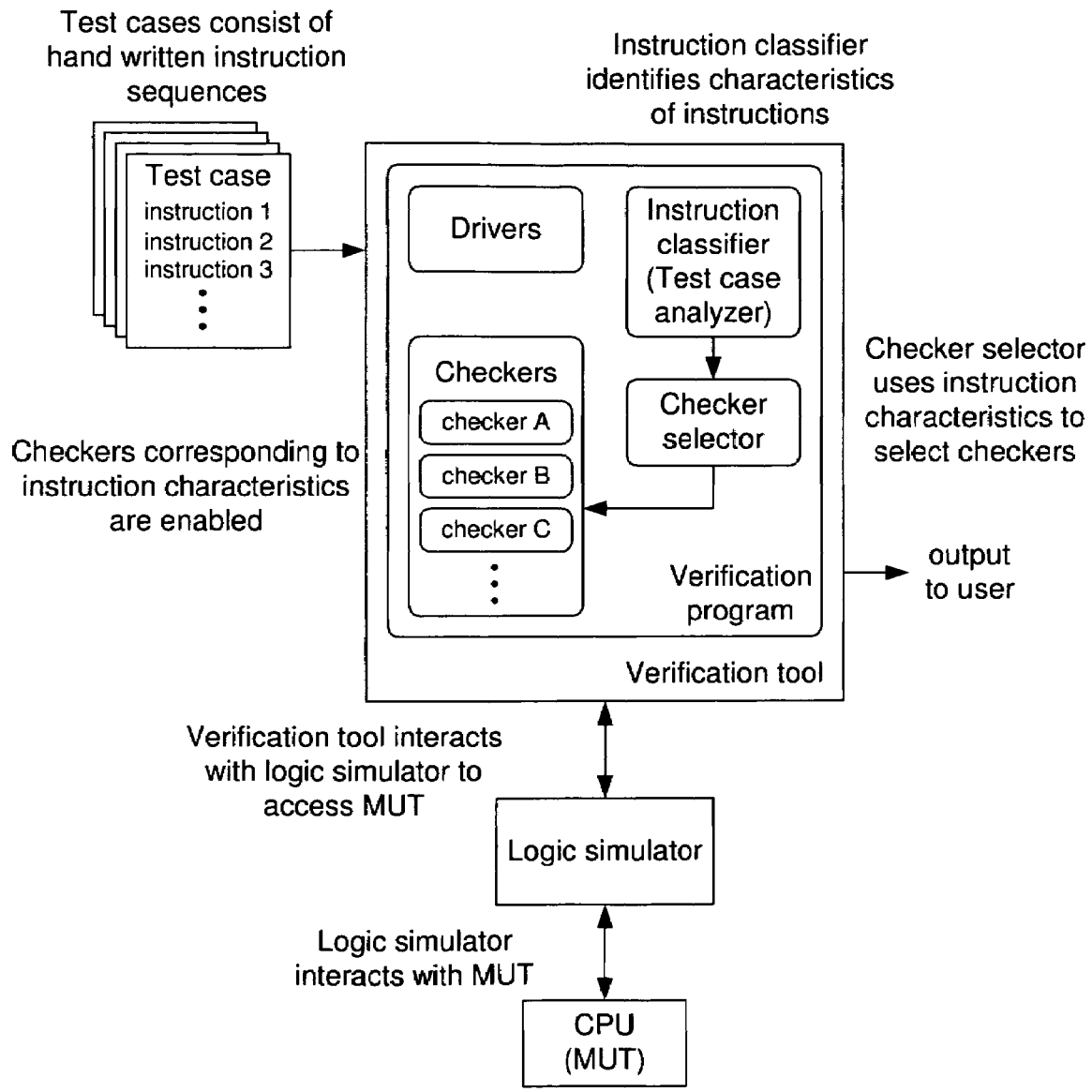
FIG. 5 is a functional block diagram illustrating an example of a design verification system in accordance with one embodiment.

Referring to FIG. 5, a functional block diagram illustrating an example of a design verification system in accordance with one embodiment is shown. In this example, the MUT is a central processing unit (CPU). The test cases for the MUT are assembler programs which include sequences of instructions to be executed by the CPU. The sequences of instructions are, in this instance, hand written by a user.

The verification tool is a computing system configured to execute a verification program. The verification program is written in the verification language that is appropriate for the verification tool. The checkers are written in the same verification language as the rest of the verification program.

In this particular example, the test case characteristics are the types of CPU instructions that are included in the instruction sequences. The instruction types may be relatively broad, such as load/store instructions, cache operation instructions, arithmetic logic unit instructions, etc., or they may be more narrow, such as load word instructions, add floating point instructions, etc.

The test case analyzer in this example is an instruction classifier. The instruction classifier identifies the type of each instruction in the test cases so that the appropriate ones of the checkers can be enabled or disabled. The checker selector enables or disables the checkers by switching them on or off, depending upon whether corresponding types of instructions are present in the test cases.

The checkers for each test case characteristic (for each type of CPU instruction) are written as assertions. The verification language is defined so that each assertion can be turned on or off by listing the assertion name for each test case characteristic (instruction type) that applies to the test case. For example, the checkers could be selectively enabled/disabled for a batch of test cases using language syntax similar to the following:

```
when instruction_loadw_is_used == true enable {
    Assertion1_for_instruction_loadw
    Assertion2_for_instruction_loadw
    Assertion3_for_instruction_loadw
}
when instruction_addf_is_used == true enable {
    Assertion1_for_instruction_addf
    Assertion2_for_instruction_addf
}
when instruction_br_is_used == false disable {
    Assertion1_for_instruction_br
    Assertion2_for_instruction_br
}
```

Here, instruction_loadw_is_used is true when a "load word" instruction is used and is false otherwise, instruction_addf_is_used is true when a "add floating point" instruction is used and is false otherwise, and instruction_br_is_used is true when a branch instruction is used and is false otherwise. Each of the assertions (e.g., Assertion1_for_instruction_loadw) indicates an expected response or condition resulting from the corresponding instruction. When a particular assertion is enabled, the corresponding checker will monitor the simulation to verify that the expected response or condition is true. When an assertion is disabled, the checker does not verify that the response or condition is as expected.

In an alternative embodiment, a portion of the verification program could be configured to read in the test cases one at a time, and to selectively enable/disable the checkers for the individual test cases. In this embodiment, the checkers could be enabled/disabled using language syntax similar to the following:
    instruction_loadw_is_used:=true
    instruction_addf_is_used:=false
    instruction_br_is_used:=true Then, each time a new test case is run, the verification program can switch checkers on or off as appropriate for the individual test case that is being simulated.

When the checkers have been selected (switched on or off by setting the corresponding logical variables instruction_loadw_is_used, instruction_addf_is_used and instruction_br_is_used,) the test case is run. The verification tool provides the necessary inputs for the simulated device to the logic simulator, which then interacts with the CPU (the MUT.) Information regarding the operation of the CPU is fed back to the logic simulator, which in turn provides information to the verification tool. The verification tool then provides verification coverage data, including information as to which checkers were enabled/disabled, to the user.

An example of the benefits of this verification environment is described below. In this example, the design verification environment described above is used to verify the operation of a PowerPC processor. The example illustrates the benefit of the present verification environment in relation to a Reservation on successful Store Conditional instructions.

The PowerPC processor ISA's synchronization specification defines Load and Reserve instructions and Store Conditional instructions to implement atomic access to memory. (The details of the PowerPC atomic memory access scheme are described in various PowerPC architecture texts that are commercially available.) The PowerPC scheme defines instruction mnemonics lwarx (Load Word And Reserve Indexed), ldarx (Load Droubleword And Reserve Indexed), stwcx. (Store Word Conditional Indexed) and stdcx. (Store Doubleword Conditional Indexed) for this purpose. Mnemonics lwarx and ldarx are collectively referred to as LARX, and stwcx and stdcx. are collectively referred to as STCX for the purposes of the following description.

For a STCX instruction to successfully complete, there must be a reservation for the STCX address. This reservation is established by a LARX instruction which precedes the STCX instruction. Further, there must not be any other store to the same address between execution of the LARX instruction and the STCX instruction in order for the reservation to be valid at the time of execution of the STCX instruction.

It is assumed that there is a checker named "STCXneedsReservation" which is configured to ensure that every successfully completed STCX instruction had a valid reservation at the time it was executed (according to the rule described above.) In order to do this, the STCXneedsReservation checker must probe the processor's pipeline at every cycle to watch for any STCX completion.

If the STCXneedsReservation checker is always enabled, this checker will probe the processor's pipeline every cycle, whether the test cases that are being run contain STCX instructions or not. This can consume a great deal of simulation time and, if there are no STCX instructions, the time will be wasted. No benefit is gained from the resources that were expended in implementing this check.

This simulation time can be saved if it can be determined that there are no STCX instructions in a test case, and the STCXneedsReservation checker disabled. The presence of STCX instructions in a test case can be easily determined in a test case analyzer by searching the test case (a sequence of PowerPC assembler instructions) for the STCX (stwcx and stdcx) mnemonics. If these mnemonics are contained in the test case, the test case can be categorized as "includes_STCX." If not, the test case can be categorized as "includes_NO_STCX." "includes_STCX" and "includes_ NO_STCX" are used here as identifiers of the corresponding test case characteristics. By loading the STCXneedsReservation checker (which is implemented as a dynamically-loadable object for the simulator) into the simulation environment only when test cases which are categorized as "includes_STCX" are run, the STCXneedsReservation checker can effectively be turned on only for the test cases for which the checker is significant. In test cases for which the STCXneedsReservation checker is not significant, no processing resources are expended in running the simulation.

"Computing system," as used herein, is intended to include any type of data processing or instruction processing system capable of performing the functions described herein. "Media readable by a computing system," as used herein, refers to any medium that can store program instructions that can be executed by a computing system, and includes floppy disks, hard disk drives, CD-ROMs, DVD-ROMs, RAM, ROM, DASD arrays, magnetic tapes, floppy diskettes, optical storage devices and the like.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs), application specific integrated circuits (ASICs), field programmable gate arrays (FPGAs) or other programmable logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A design verification tool for verifying a device design, the design verification tool comprising:
    a computing system configured to execute a design verification program, wherein the design verification program includes a test case analyzer, a plurality of design verification checkers and a checker selector;
    wherein the test case analyzer is configured to
        receive one or more test cases, wherein the test cases define scenarios which exercise corresponding features of the device design
        analyze the received test cases and
        identify one or more test case characteristics associated with each of the test cases, wherein the test case characteristics describe features of the device design that will be exercised by the associated test cases;
    wherein each of the design verification checkers is configured to verify a corresponding
        one of the test case characteristics in the simulated device; and
    wherein checker selector is configured to
        receive from the test case analyzer identification of the test case characteristics associated with each of the test cases, and
        selectively enable a first set of the design verification checkers and disable a second set of the design verification checkers based on the identification of the test case characteristics received from the test case analyzer.

2. The design verification tool of claim 1, wherein the test case analyzer is configured to associate one or more test case characteristic identifiers with each of the test cases, and wherein each of the test case characteristic identifiers identifies a corresponding test case characteristic.

3. The design verification tool of claim 2, wherein the test case characteristic identifiers are provided to the checker selector as identification of the test case characteristics associated with each of the test cases, wherein each of the design verification checkers is associated with one or more of the test case characteristic identifiers, and wherein the checker selector is configured to enable ones of the design verification checkers that are associated with the test case characteristic identifiers provided by the test case analyzer.

4. The design verification tool of claim 1, wherein the design verification tool is configured to provide verification coverage data to a user, wherein the verification coverage data includes information identifying the checkers in the first set.

5. The design verification tool of claim 1, wherein the verification tool is configured to test integrated circuits.

6. The design verification tool of claim 1, wherein the verification tool is configured to enable the first set of checkers by loading dynamically loadable objects corresponding to the first set.

7. A method implemented in a design verification environment comprising:
providing one or more test cases to a design verification program, wherein the test cases define scenarios which exercise corresponding features of a device design;
analyzing the received test cases and identifying one or more test case characteristics associated with each of the test cases, wherein the test case characteristics describe features of the device design that will be exercised by the associated test cases;
selectively enabling a first set of design verification checkers of the design verification program and disabling a second set of design verification checkers of the design verification program based on the identified test case characteristics; and
the design verification program executing the test cases with the first set of design verification checkers enabled and the second set of design verification checkers disabled.

8. The method of claim 7, further comprising analyzing the test cases and associating test case characteristic identifiers with each of the test cases to identify test case characteristics associated with each of the test cases.

9. The method of claim 8, further comprising providing a superset of checkers which includes the first and second sets of checkers, wherein each of the superset of checkers is associated with one or more test case characteristic identifiers.

10. The method of claim 9, wherein enabling the first set of checkers comprises determining a set of the test case characteristic identifiers associated with the test cases and enabling ones of the superset of checkers that are associated with the set of test case characteristic identifiers.

11. The method of claim 7, further comprising providing verification coverage data to a user, wherein the verification coverage data includes information identifying the checkers in the first set.

12. The method of claim 7, wherein the method is implemented in a design verification environment configured to test integrated circuits.

13. The method of claim 7, wherein enabling the first set of checkers comprises providing the first and second sets of checkers as dynamically loadable objects, and loading only ones of the dynamically loadable objects corresponding to the first set.

14. A software program product comprising a storage medium readable by a computing system, wherein the storage medium contains a design verification program configured to cause the computing system to perform the method comprising:
receiving one or more test cases, wherein the test cases define scenarios which exercise corresponding features of a device design;
analyzing the received test cases and identifying one or more test case characteristics associated with each of the test cases, wherein the test case characteristics describe features of the device design that will be exercised by the associated test cases;
selectively enabling a first set of design verification checkers of the design verification program and disabling a second set of design verification checkers of the design verification program based on the identified test case characteristics; and
the design verification program executing the test cases with the first set of design verification checkers enabled and the second set of design verification checkers disabled.

15. The software program product of claim 14, wherein the method further comprises analyzing the test cases and associating test case characteristic identifiers with each of the test cases to identify test case characteristics associated with each of the test cases.

16. The software program product of claim 15, wherein the method further comprises providing a superset of checkers which includes the first and second sets of checkers, wherein each of the superset of checkers is associated with one or more test case characteristic identifiers.

17. The software program product of claim 16, wherein enabling the first set of checkers comprises determining a set of the test case characteristic identifiers associated with the test cases and enabling ones of the superset of checkers that are associated with the set of test case characteristic identifiers.

18. The software program product of claim 14, wherein the method further comprises providing verification coverage data to a user, wherein the verification coverage data includes information identifying the checkers in the first set.

19. The software program product of claim 14, wherein the software program product is configured to be executed in a design verification tool configured to test integrated circuits.

20. The software program product of claim 14, wherein the software program product is configured to enable the first set of checkers by loading dynamically loadable objects corresponding to the first set.

* * * * *